United States Patent
Bhargava

(10) Patent No.: US 11,437,090 B2
(45) Date of Patent: Sep. 6, 2022

(54) NEGATIVE DIFFERENTIAL RESISTANCE CIRCUITS

(71) Applicant: Arm Limited, Cambridge (GB)

(72) Inventor: Mudit Bhargava, Austin, TX (US)

(73) Assignee: Arm Limited, Cambridge (GB)

( * ) Notice: Subject to any disclaimer, the term of this patent is extended or adjusted under 35 U.S.C. 154(b) by 54 days.

(21) Appl. No.: 16/036,751

(22) Filed: Jul. 16, 2018

(65) Prior Publication Data

US 2020/0020389 A1  Jan. 16, 2020

(51) Int. Cl.
*G11C 11/419* (2006.01)

(52) U.S. Cl.
CPC .................. *G11C 11/419* (2013.01)

(58) Field of Classification Search
CPC .............. G11C 11/419; G11C 5/145
See application file for complete search history.

(56) References Cited

U.S. PATENT DOCUMENTS

| | | | | |
|---|---|---|---|---|
| 8,451,679 B1* | 5/2013 | Sharpe-Geisler | ........ | G11C 7/12 365/189.06 |
| 2004/0156241 A1* | 8/2004 | Mokhlesi | ........... | G11C 16/0458 365/185.28 |
| 2008/0094913 A1* | 4/2008 | Fasoli | ..................... | G11C 16/12 365/185.23 |
| 2011/0116300 A1* | 5/2011 | Maejima | .................. | G11C 8/08 365/148 |
| 2012/0320691 A1* | 12/2012 | Dally | .................... | G11C 11/412 365/189.15 |
| 2014/0169076 A1* | 6/2014 | Behrends | ................. | G11C 7/12 365/154 |
| 2015/0228331 A1* | 8/2015 | Katoch | ................. | G11C 11/419 365/156 |
| 2016/0064059 A1* | 3/2016 | Takahashi | ........... | G11C 11/1675 365/158 |
| 2016/0148685 A1* | 5/2016 | Roy | ................... | G11C 13/0069 365/148 |
| 2018/0158524 A1* | 6/2018 | Shin | .................... | G11C 13/0026 |

OTHER PUBLICATIONS

Wang, et al; Tunneling Negative Differential Resistance-Assisted STT-RAM for Efficient Read and Write Operations; IEEE Transations on Electron Devices; vol. 64, No. 1; Jan. 2017.
Shaodi Wang; Design, Evaluation and Co-optimization of Emerging Devices and Circuits; UCLA Dissertation; 2017.

* cited by examiner

*Primary Examiner* — Khamdan N. Alrobaie
(74) *Attorney, Agent, or Firm* — Pramudji Law Group PLLC; Ari Pramudji

(57) ABSTRACT

Various implementations described herein refer to an integrated circuit having a bitcell coupled to a bitline. The integrated circuit may include a write driver coupled to the bitline for writing data to the bitcell. The write driver may have an inverter and a clamping device that are arranged to clamp current after data has been written to the bitcell.

8 Claims, 4 Drawing Sheets

NEGATIVE DIFFERENTIAL RESISTANCE CIRCUITS

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In reference to memory storage, when writing many bits, where they share the same source signal and/or power strap, and as some bits start getting set, these bits start drawing more current from the same source and/or the same power straps. Generally, the term "set" may refer to transition of a memory element from a high impedance state to a low impedance state. This means that as more bits get set, the last few bits may see a voltage drop in write driver supply and/or a bump in the source voltage making it increasingly difficult to write the last few bits. Also, it may be likely that the last few bits are those which are having a difficult time getting set. As such, a decreased voltage for set may make it harder to set.

Further, in reference to memory storage, when writing many bits, the write operation is stochastic in nature, such that the transition of the bitcells does not happen simultaneously, but instead occurs over a wide range of time. As such, to ensure successful write across an entire row of bitcells, the write conditions (that include at least activation of the write driver(s) and the wordline) may be applied for a long duration. Some bitcells that get set may start drawing higher current from the set driver for the rest of the duration for which the set conditions are applied. This may result in a low power efficiency, especially during the set operation.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to negative differential resistance (NDR) circuits for memory applications. In some implementations, the various schemes and techniques described herein may be used for an auto-shut-off circuit with negative differential resistance (NDR) characteristics and for utilizing the NDR circuit to assist in read operations and write operations. For instance, the NDR circuit may be used to improve robustness in read operations to inhibit (or prevent) noise-induced spurious resets during reads. In other instances, the NDR circuit may be used to reduce energy of a set operation. In other instances, the NDR circuit may be used to improve robustness in write (or set) operations by inhibiting (or preventing) a 'sprinkler effect'.

In some implementations, an NDR circuit may refer to a circuit that exhibits negative differential resistance in some region of its current-voltage (IV) characteristics, and an auto-shut-off circuit may refer to a circuit that automatically turns-off and exhibits increasing resistivity as voltage across it increases. The NDR circuit may refer to multiple classes of circuits, such as, e.g., an N-type version and a complimentary P-type version of NDR circuits. In some instances, the NDR circuit may exhibit a negative differential resistance region. In other instances, the NDR circuit may show monotonically reducing conductance (i.e., increasing resistance) with increasing voltage across its terminals in a certain operating region. In other instances, various schemes and techniques may refer to ways to control the current-voltage (IV) characteristics of the NDR circuit.

Various implementations described herein are directed to negative differential resistance (NDR) assisted read and write in memory applications for improved read and write robustness and improved write energy. In reference to using an NDR circuit to assist in read and write operations, the NDR circuit may be used for an improved robustness in read operations to inhibit (or prevent) noise-induced spurious resets during reads. The NDR circuit may be used for reducing energy of a set operation over conventional designs. The NDR circuit may be used for controlling maximum compliance current in set operations. The NDR circuit may be used for improved robustness in write (set) operations by inhibiting (or preventing) a 'sprinkler effect', as described herein above.

Various implementations of negative differential resistance (NDR) circuitry for memory applications will now be described herein with reference to FIGS. 1-4B.

Figure 1:
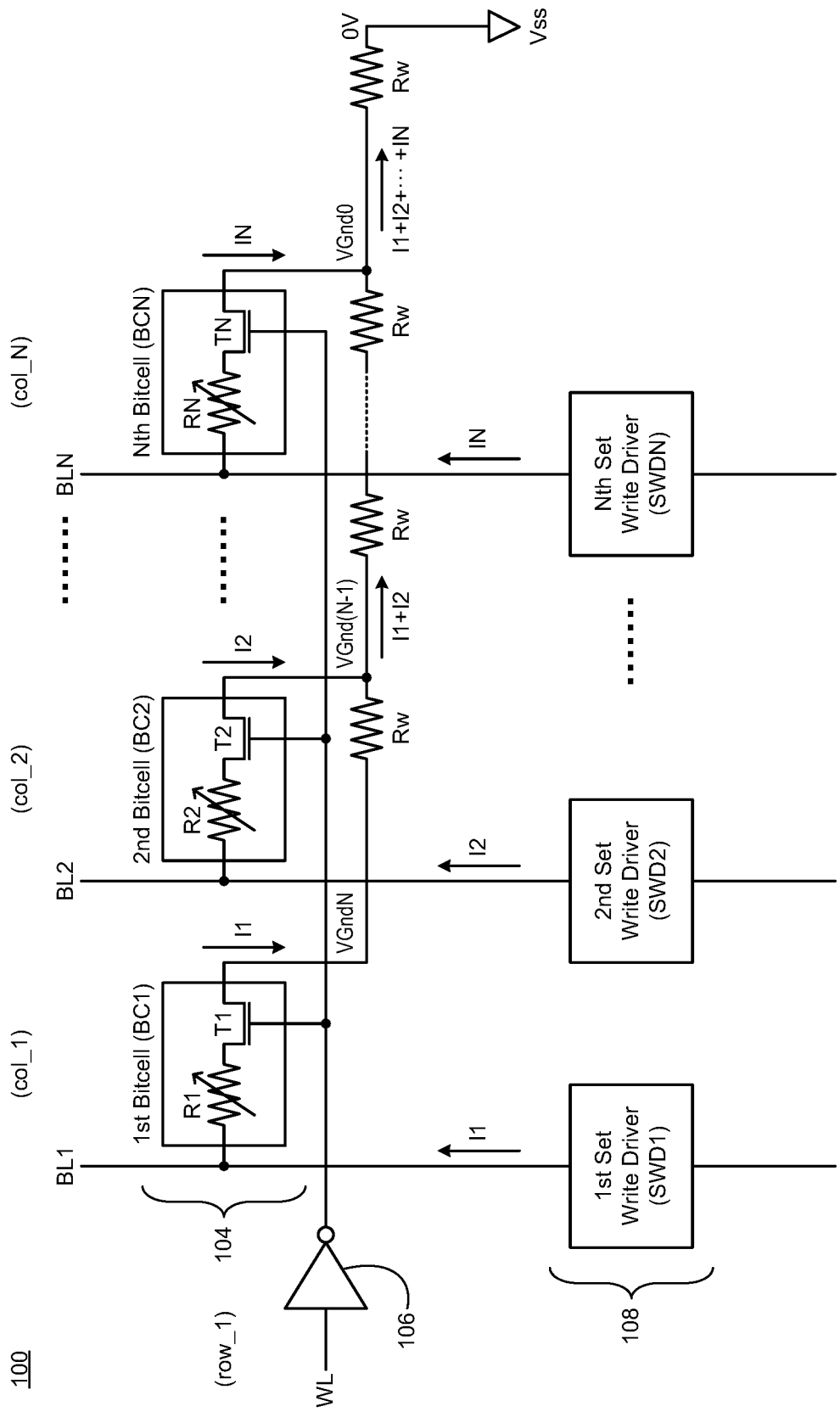
FIG. 1 illustrates a diagram of memory circuitry in accordance with various implementations described herein.

FIG. 1 illustrates a diagram of memory circuitry 100 with negative differential resistance (NDR) operating characteristics in accordance with various implementations described herein. As shown in FIG. 1, the memory circuitry 100 may include various memory related circuit components, such as, e.g., an array of bitcells 104, a wordline driver 106, and write support circuitry 108.

The array of bitcells 104 may be implemented with any number (N) of bitcells (BC1, BC2, . . . , BCN). Even though one row of bitcells (row_1) is shown, the array of bitcells 104 may be implemented with multiple rows of bitcells (row_1, row_2, . . . , row_N) that are arranged in multiple columns (col_1, col_2, . . . , col_N). As such, the memory circuitry 100 includes the array of bitcells 104 having any number (N) of bitcells (BC1, BC2, . . . , BCN) arranged in a two-dimensional (2D) array with any number (N) of rows (row_1, row_2, . . . , row_N) and any number of columns (col_1, col_2, . . . , col_N). In this instance, the bitcells (BC1, BC2, . . . , BCN) are accessible via corresponding bitlines (BL1, BL2, . . . , BLN). However, in other instances, the bitlines (BL1, BL2, . . . , BLN) may include complementary bitlines (BL, NBL), where the bitcells (BC1, BC2, . . . , BCN) are accessible via corresponding complementary bitlines (BL1/NBL1, BL2/NBL2, . . . , BLN/NBLN). Also, as shown, each of the bitcells (BC1, BC2, . . . , BCN) may be coupled to a wordline (WL) via the wordline driver 106. The write support circuitry 108 may include any number (N) of set write drivers (SWD1, SWD2, . . . , SWDN) that are coupled to corresponding bitlines (BL1, BL2, . . . , BLN) so as to provide negative differential resistance (NDR) circuitry in a manner as described in greater detail herein.

Each bitcell (BC1, BC2, . . . , BCN) may be referred to as a memory cell, and each memory cell may be configured to store at least one data bit value (e.g., related to storing logic 0 or 1). In some instances, the memory cells of the memory cell array 104 may be implemented with DRAM like circuitry having at least one resistive component (R) and at least one transistor (T). For instance, as shown, each bitcell (BC1, BC2, . . . , BCN) may be implemented with CeRAM (Correlated electron RAM) having a corresponding resistive component (R1, R2, . . . , RN) as a bitcell storage device and a corresponding transistor (T1, T2, . . . , TN) as a bitcell access device.

In other instances, the memory cells of the memory cell array 104 may be implemented with SRAM circuitry. Thus, in some of these cases, each memory cell may include a multi-transistor SRAM cell, including various types of SRAM cells, such as, e.g., 6T CMOS SRAM and/or other types of CMOS SRAM cells, such as, e.g., 4T, 8T, 10T or more transistors per bit. Thus, the memory cells may include SRAM cells, and the memory cell array 106 may include an SRAM cell array. However, various other types of memory may be used.

In some instances, each bitcell (BC1, BC2, . . . , BCN) may have a corresponding resistance related component (R1, R2, . . . , RN) that operates as a storage device for each bitcell (BC1, BC2, . . . , BCN). The 11 to IN refers to write current, and Rw refers to wire resistance. Voltage may be calculated as follows:

$$VGnd0 = 0V + (I1 + I2 + \ldots + IN) * Rw$$

$$VGnd1 = VGnd0 + (I1 + I2 + \ldots + I(N-1)) * Rw$$

$$VGndN = VGnd(n-1) + (I1) * Rw$$

The change in voltage across the first bitcell (BC1) may be as follows:

$$\Delta V \text{ across } BC1 = VBL2 - VGndN$$

The memory circuitry 100 may be implemented as an integrated circuit (IC) with various other related circuit components. The memory circuitry 100 may be designed as a system-on-a-chip (SoC) that integrates the memory circuitry 100 and the various other related circuit components on a single chip. The memory circuitry 100 may be used as an embedded system for various electronic and mobile applications.

Figure 2:
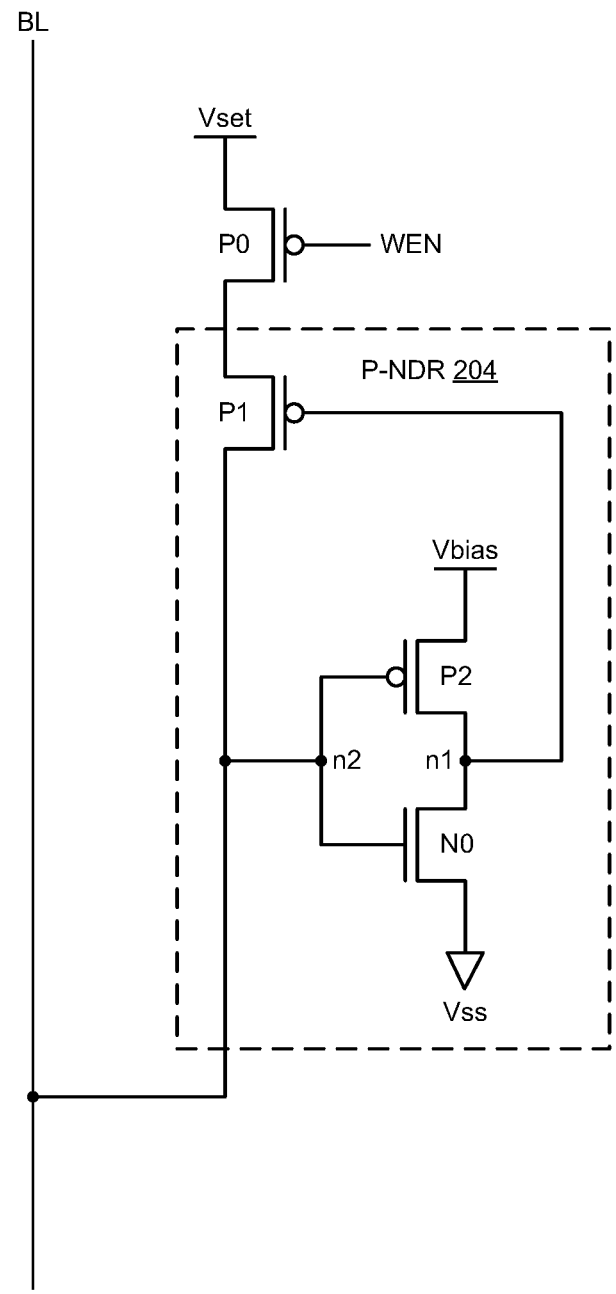
FIG. 2 illustrates a diagram of write stability circuitry in accordance with various implementations described herein.

FIG. 2 illustrates a diagram of write stability circuitry 200 in accordance with implementations described herein. In some instances, the write stability circuitry 200 may be implemented as an auto-shut-off circuit, which may provide energy savings as well as write robustness. The write stability circuitry 200 (or auto-shut-off write circuit) may be implemented with a set write driver (SWD) 202 as shown in FIG. 2, which may be implemented as any one of the set write drivers (SWD1, SWD2, . . . , SWDN) in FIG. 1.

In some implementations, as shown in FIGS. 1-2, the memory circuitry 100 of FIG. 1 may include at least one bitcell (e.g., BC1, BC2, . . . , BCN) that is coupled to at least one bitline (e.g., corresponding bitlines BL1, BL2, . . . , BLN). The memory circuitry 100 may include at least one set write driver (e.g., SWD1, SWD2, . . . , SWDN) that is coupled to the at least one bitline (e.g., corresponding bitlines BL1, BL2, . . . , BLN) for writing data to the at least one bitcell (e.g., BC1, BC2, . . . , BCN).

As shown in FIG. 2, the write circuitry 200 may be implemented with the set write driver (SWD) 202 having a clamping circuit P-NDR 204. In this instance, the set write driver (SWD) 202 has multiple transistors (P0, P1, P2, N0) that are arranged to operate with negative differential resistance (NDR) characteristics, and also, the clamping circuit P-NDR 204 may operate as a P-type NDR (P-NDR) circuit. In some instances, the set write driver (SWD) 202 may be implemented with a driving set transistor (P0) that is coupled between a set voltage source (Vset) and a clamping device (P1). The driving set transistor (P0) may be implemented with a PMOS transistor that is activated with a write enable signal (WEN). The set write driver (SWD) 202 may include an inverter (P2, N0) and the clamping device (P1) that are arranged to clamp current after data has been written to the at least one bitcell (e.g., BC1, BC2, . . . , BCN). As shown, the inverter (P2, N0) may be coupled between a bias voltage source (Vbias) and ground voltage source (Vss). Also, the inverter (P2, N0) and the clamping device (P1) may operate with negative differential resistance characteristics. The clamping device (P1) may provide for power saving of write operations when writing data to the bitcell (e.g., BC1, BC2, . . . , BCN). Further, the write operations may have improved stability and/or power savings due to lower ground bounce on a shared ground line across a row of bitcells that includes the bitcell.

The inverter (P2, N0) may be implemented with a PMOS transistor (P2) and an NMOS transistor (NO) that are arranged to activate the clamping device (P1) based on a bitline signal from the bitline (e.g., corresponding bitlines BL1, BL2, . . . , BLN) or based on an output of the clamping device (P1). The clamping device (P1) may be implemented with a clamp transistor (P1) that is coupled between the driving set transistor (P0) and the bitline (e.g., corresponding bitlines BL1, BL2, . . . , BLN). The clamping transistor (P1) may be implemented with a PMOS transistor. As shown, an output of the inverter (P2, N0) at node n1 may be coupled to a gate of the clamping transistor (P1) for activation thereof, and in some instances, an output of the clamping transistor (P1) may be coupled to gates of the PMOS transistor P2 and the NMOS transistor N0 at node n2 for activation of the inverter (P2, N0). Also, as shown, the output of the clamping transistor (P1) and node n2 are coupled to the bitline (BL)

Figure 3:
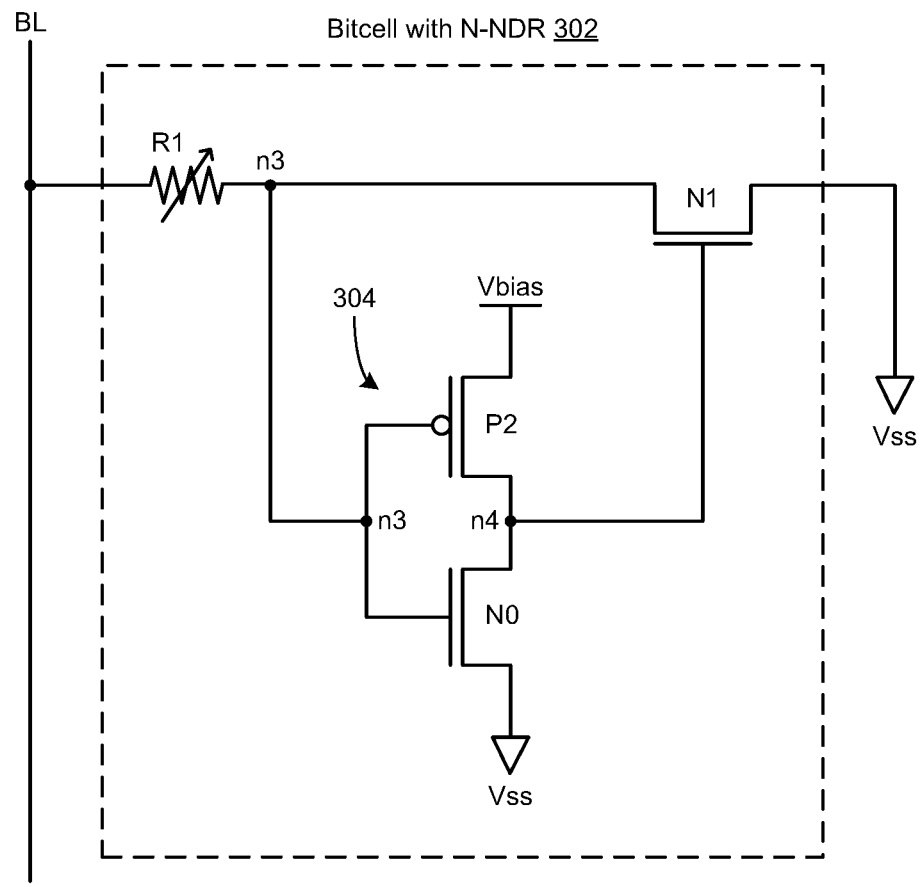
FIG. 3 illustrates a diagram of read stability circuitry in accordance with various implementations described herein.

FIG. 3 illustrates a diagram of read stability circuitry 300 in accordance with implementations described herein.

As shown in FIG. 3, the read stability circuitry 300 may include a bitcell 302 (e.g., CeRAM bitcell) that is coupled to a bitline (BL), which may refer to at least one of the corresponding bitlines (BL1, BL2, . . . , BLN) in FIG. 1. The bitcell 302 may refer to and/or be implemented as an N-NDR bitcell. The bitcell 302 may include a storage device (R1) that is coupled to the bitline (BL). In some instances, the storage device (R1) may be implemented with a resistive component (R1). The bitcell 302 may include an access device (N1) that is coupled to the storage device (R1). As shown, the access device (N1) may be coupled between the storage device (R1) and a voltage source (Vss), which may be ground (Gnd). In some instances, as shown, the access device (N1) may be implemented with an NMOS transistor. In other instances, the access device (N1) may be implemented with a PMOS transistor in a different configuration.

The read stability circuitry 300 may include a clamping circuit 304 (e.g., an inverter P0, N0) that is coupled between the storage device (R1) and a gate of the access device (N1). The inverter (P0, N0) is coupled between a bias voltage source (Vbias) and ground (Vss). The inverter (P0, N0) may receive a signal from the storage device (R1) at node n3, which is provided to gates of transistors (P0, N0). The transistors (P0, N0) may be activated based on the signal from the storage device (R1). Also, an output from the inverter (P0, N0) at node n4 is coupled to a gate of the access device (N1). The access device (N1) is activated based on the output signal from the inverter (P0, N0).

In some instances, the clamping circuit 304 may be internal to (or disposed within a boundary of) the bitcell 302. The clamping circuit 304 may include various circuit components (e.g., transistors P0, N0) that are arranged (or configured) to clamp current and/or voltage while data is being read from the bitcell 302. In some implementations, the various circuit components (P0, N0) of the clamping circuit 304 may operate with negative differential resistance (NDR) characteristics, and as such, the clamping circuit 304 may increase stability of read operations when data is read from the bitcell 302.

In some implementations, the read stability circuitry 300 has a measurable resistance related characteristic that is associated with the storage device (R1) of the bitcell 302. As shown in FIG. 3, the clamping circuit 304 may be implemented with an N-type NDR (N-NDR) circuit. The N-NDR circuit 304 is coupled between the storage device (R1) and the gate of the access device (N1). Also, as shown, the access device (N1) may be implemented with an NMOS transistor (N1), which is coupled between the storage device (R1) and ground (Vss). In other instances, the access device (N1) may be implemented with a PMOS transistor in a different configuration.

Figure 4A:
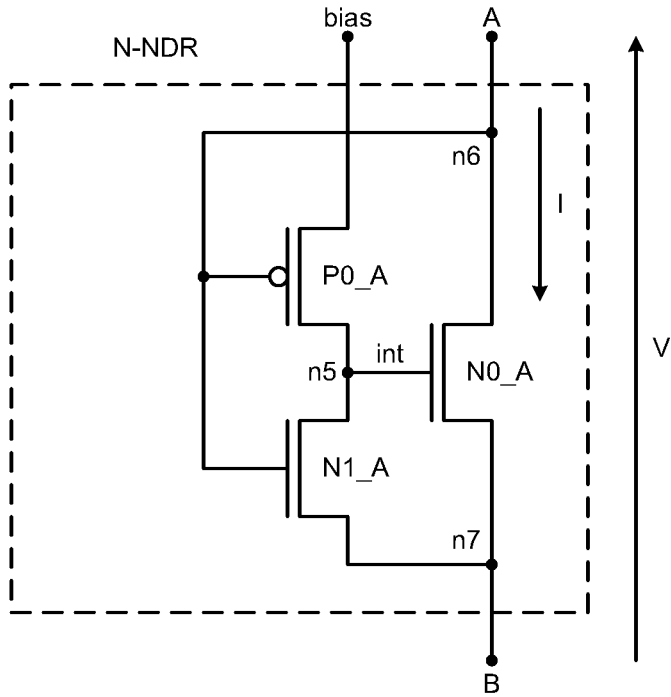
FIGS. 4A-4B illustrate various diagrams of negative differential resistance (NDR) circuits in accordance with various implementations described herein.
Figure 4B:
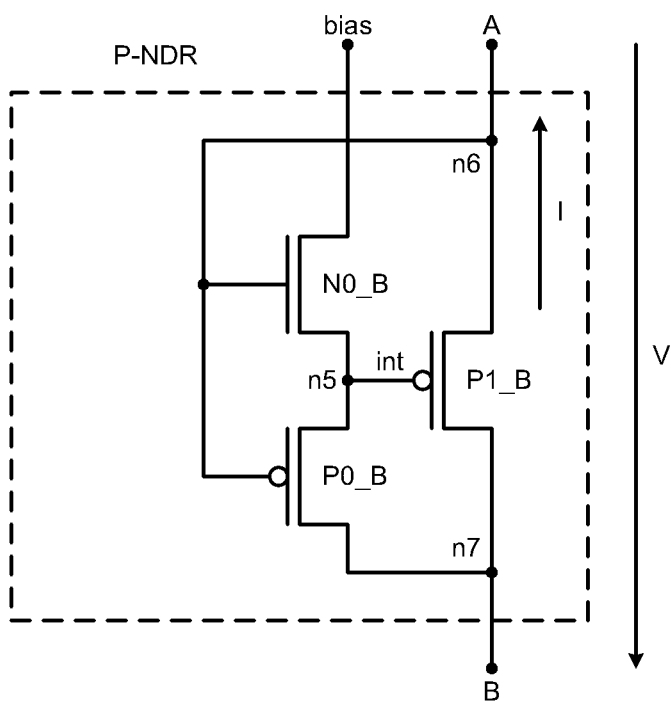

FIGS. 4A-4B illustrate various diagrams of negative differential resistance (NDR) circuits 400A, 400B in accordance with various implementations described herein. In particular, FIG. 4A illustrates a first circuit diagram of an n-type negative differential resistance (N-NDR) circuit 400A, and FIG. 4B illustrates a second circuit diagram of a p-type negative differential resistance (P-NDR) circuit 400B. As shown in FIGS. 4A-4B, the NDR circuits 400A, 400B have multi-terminal (A, B) resistance such that when voltage goes high, the multi-terminal (A, B) resistance may become substantially large. In some implementations, as shown in reference to FIGS. 2-3, the NDR circuits 400A, 400B in FIGS. 4A-4B may be implemented as the clamping circuits P-NDR 204 of FIG. 2 and the N-NDR circuit 302 of FIG. 3.

As shown in FIGS. 4A-4B, the NDR circuits 400A, 400B include a first device (e.g., N0_A, P1_6) that is coupled between multiple terminals (e.g., terminals A, B), which may be referred to as input/output (IO) terminals. The first device (e.g., N0_A, P1_B) may operate to clamp current between the multiple terminals (e.g., terminals A, B) based on a first activation signal (e.g., intermediate (int) signal at node n5).

The NDR circuits 400A, 400B may also include a second device (e.g., inverter P0_A, N1_A or inverter N0_13, P0_B) that is coupled between the multiple terminals (e.g., terminals A, B), the first device (e.g., N0_A, P1_B) and a bias voltage source (e.g., Vbias). The second device (e.g., inverter P0_A, N1_A or inverter N0_13, P0_B) may operate to generate the first activation signal (e.g., intermediate (int) signal at node n5) based on the bias voltage (e.g., Vbias). The second device (e.g., inverter P0_A, N1_A or inverter N0_13, P0_B) may also operate to activate the first device (e.g., N0_A, P1_B) with the first activation signal (e.g., intermediate (int) signal at node n5) based on a second activation signal (e.g., signal from terminal A at node n6) received from one terminal (e.g., terminal A at node n6) of the multiple terminals (e.g., terminals A, B).

The first device (e.g., N0_A, P1_B) may be used as a clamping transistor, such as, e.g., a clamping transistor N0_A in FIG. 4A and/or another clamping transistor P1_B in FIG. 4B. The clamping transistors (N0_A, P1_B) may be activated based on the first activation signal (int) that is received from the second device (e.g., inverter P0_A, N1_A or inverter N0_13, P0_B). Thus, the second device (e.g., inverter P0_A, N1_A or inverter N0_13, P0_B) may be implemented with an inverter having a first transistor (e.g., P0_A in FIG. 4A and N0_B in FIG. 4B) and a second transistor (e.g., N1_A in FIG. 4A and P0_B in FIG. 4B) that are arranged to be activated based on the second activation signal (e.g., signal from terminal A at node n6) and also provide the first activation signal (int) to the clamping transistor (N0_A in FIG. 4A and P1_B in FIG. 4B) based on the second activation signal (e.g., signal from terminal A at node n6). The inverter (e.g., inverter P0_A, N1_A or inverter N0_13, P0_B) may be coupled between the bias voltage source (e.g., Vbias) and another terminal (e.g., terminal B at node n7) of the multiple terminals (e.g., terminals A, B).

In some implementations, as shown in FIG. 4A, the first device (N0_A) may be implemented with an NMOS transistor that operates as a clamping device, and the second device (inverter P0_A, N1_A) may be implemented with a PMOS transistor and another NMOS transistor that are arranged to operate as an inverter.

In some implementations, as shown in FIG. 4B, the first device (P1_B) may be implemented with PMOS transistor that operates as a clamping device, and the second device (inverter N0_B, P0_B) may be implemented with an NMOS transistor and another PMOS transistor that are arranged to operate as an inverter.

As shown in FIG. 4A, the clamping circuit 400A may be implemented as an inverter based N-NDR circuit. The clamping circuit 400A may include an inverter (P0_A, N1_A) and a clamping device (N0_A) that are arranged to clamp current after data has been read from a bitcell or while data is being read from the bitcell, such as, e.g., the bitcell 302 of FIG. 3. The inverter (P0_A, N1_A) and the clamping device (N0_A) may operate with negative differential resistance (NDR) characteristics, and the clamping circuit 400A may restrict (inhibit or limit) current and/or voltage of the bitline (BL) during read operations to provide increased stability of read operations when data is read from the bitcell. The inverter (P0_A, N1_A) may be implemented with a PMOS transistor (P0_A) and an NMOS transistor (N1_A) that are arranged to activate the clamping device (N0_A) based on a bitline signal from a bitline (BL). The clamping device (N0_A) may be implemented with a clamp transistor that is coupled between terminals (A, B), and the clamp transistor (N0_A) may be implemented with an NMOS transistor (N0_A).

The clamping circuit 400A operates as a negative differential resistance (NDR) circuit that is implemented as an inverter based N-type NDR (N-NDR) circuit. As shown, the clamping transistor (N0_A) is coupled between two terminals (A, B), wherein as the voltage goes high, the two terminal A-B resistance across the clamping transistor (N0_A) becomes substantially large. In this instance, the voltage (V) is measured from terminal B to terminal A, and the current (I) flows from terminal A to terminal B. As shown, the inverter (P0_A, N1_A) provides an intermediate (int) voltage from node n1 to a gate of the clamping transistor (N0_A) for activation of clamping transistor (N0_A). In reference to the inverter (P0_A, N1_A), the PMOS transistor (P0_A) is coupled between a bias voltage (bias) and node n1, and the NMOS transistor (N1_A) is coupled between node n1 and terminal B. Also, terminal A is coupled to gates of the PMOS transistor (P0_A) and the NMOS transistor (N1_A) for activation of the inverter (P0_A, N1_A).

In reference to the N-NDR circuit of FIG. 4A, the inverter based NDR circuit (NDR-Inv) may operate in a following manner when terminal B is coupled to ground (Vss) and the voltage (V) of terminal A rises. Initially, transistor N0_A may be in a linear mode of operation, and hence, NDR may act like a linear resistor. At some higher voltage (V), the gate voltage of transistor N0_A may decrease, and hence, its resistance may increase and eventually at much higher voltages at terminal A, and the intermediate (int) voltage at node n1 may fall to nearly 0V, and NDR acts like an open. In NDR-Inv, a net int voltage may be an inverted version of the terminal A voltage.

Some implementations may refer to an effect of changing the voltage threshold (Vth) of transistor (N1-A). For instance, since a roll-off of the NDR happens when N1_A gate voltage is near its Vth, different Vth devices may be selected for N1_A so as to set a different roll-off voltage. For the NDR-Inv, different trip voltages may be selected for the inverter (P0_A, N1_A) using various design techniques for a specific roll-off voltage.

As shown in FIG. 4B, the clamping circuit 4006 may be implemented as an inverter based P-NDR circuit. The clamping circuit 4006 may include an inverter (N0_B, P0_B) and a clamping device (P1_13) that are arranged to clamp current after data has been read from the bitcell or while data is being read from the bitcell, such as, e.g., the bitcell 302 of FIG. 3. The inverter (N0_B, P0_B) and the clamping device (P1_13) may operate with negative differential resistance (NDR) characteristics, and the clamping circuit 4006 may increase stability of read operations when data is read from the bitcell. The inverter (N0_B, P0_B) may be implemented with a PMOS transistor and an NMOS transistor that are arranged to activate the clamping device (P1_13) based on output of the bitcell. The clamping device (P1_13) may be implemented with a clamp transistor that is coupled between terminals (A, B). The clamp transistor (P1_13) may be implemented with a PMOS transistor.

The clamping circuit 4006 operates as a negative differential resistance (NDR) circuit that is implemented as an inverter based P-type NDR (P-NDR) circuit. As shown, the clamping transistor (P1_13) is coupled between two terminals (A, B), wherein as the voltage goes high, the two terminal A-B resistance across the clamping transistor (N0_A) becomes substantially large. In this instance, the voltage (V) is measured from terminal B to terminal A, and the current (I) flows from terminal A to terminal B. As shown, the inverter (N0_B, P0_B) provides an intermediate (int) voltage from node n1 to a gate of the clamping transistor (P1_13) for activation of clamping transistor (P1_13). In reference to the inverter (N0_B, P0_B), the NMOS transistor (N0_B) is coupled between a bias voltage (bias) and node n1, and the PMOS transistor (P0_B) is coupled between node n1 and terminal B. Also, terminal A is coupled to gates of the NMOS transistor (N0_B) and the PMOS transistor (P0_B) for activation of the inverter (N0_B, P0_B).

Described herein are various implementations of an integrated circuit. The integrated circuit may include a bitcell coupled to a bitline. The integrated circuit may include a write driver coupled to the bitline for writing data to the bitcell. The write driver may have an inverter and a clamping device that are arranged to clamp current after data has been written to the bitcell.

Described herein are various implementations of an integrated circuit. The integrated circuit may include a bitcell having a storage device and an access device coupled to a bitline. The integrated circuit may include a clamping circuit coupled between the storage device and the access device. The clamping circuit may include a clamping device that is arranged to clamp current while data is read from the bitcell.

Described herein are various implementations of an integrated circuit. The integrated circuit may include a first device coupled between multiple terminals. The first device may operate to clamp current between the multiple terminals based on a first activation signal. The integrated circuit may include a second device coupled between the multiple terminals, the first device and a bias voltage source. The second device may operate to generate the first activation signal based on the bias voltage, and the second device may operate to activate the first device with the first activation signal based on a second activation signal received from one terminal of the multiple terminals.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   a bitcell coupled to a bitline; and
   a write driver coupled to the bitline for writing data to the bitcell,
   wherein the write driver has an inverter and a clamping device that are arranged to clamp current after data has been written to the bitcell, and
   wherein an input of the inverter is coupled to an output of the clamping device and an output of the inverter is directly connected to a gate of the clamping device to control activation of the clamping device.

2. The integrated circuit of claim 1, wherein the inverter and the clamping device operate with negative differential resistance (NDR) characteristics.

3. The integrated circuit of claim 1, wherein the clamping device increases stability of write operations when writing data to the bitcell, and wherein the write operations have improved stability due to lower ground bounce on a shared ground line across a row of bitcells that includes the bitcell.

4. The integrated circuit of claim 1, wherein the write driver comprises a set transistor.

5. The integrated circuit of claim 4, wherein the set transistor is a p-type metal-oxide-semiconductor (PMOS) transistor.

6. The integrated circuit of claim 1, wherein the inverter comprises a p-type metal-oxide-semiconductor (PMOS) transistor and an n-type MOS (NMOS) transistor that are arranged to activate the clamping device based on a bitline signal from the bitline or based on the output of the clamping device.

7. The integrated circuit of claim 4, wherein the clamping device comprises a clamp transistor coupled between the set transistor and the bitline.

8. The integrated circuit of claim 7, wherein the clamp transistor comprises a p-type MOS (PMOS) transistor.

* * * * *